United States Patent
Wong et al.

[11] Patent Number: 5,402,081
[45] Date of Patent: Mar. 28, 1995

[54] INPUT BUFFER CIRCUIT WITH IMPROVED SPEED PERFORMANCE

[75] Inventors: Jack T. Wong, Fremont; Fabiano Fontana, Santa Clara; Susan Nguyen, San Jose, all of Calif.

[73] Assignee: Advanced Micro Devices, Inc., Sunnyvale, Calif.

[21] Appl. No.: 135,812

[22] Filed: Oct. 12, 1993

[51] Int. Cl.$^6$ .............................................. H03K 3/01
[52] U.S. Cl. .................... 327/256; 327/108; 327/313; 327/379
[58] Field of Search ............ 307/270, 264, 572, 296.8, 307/263, 549, 550, 568, 443

[56] References Cited

U.S. PATENT DOCUMENTS

| | | | |
|---|---|---|---|
| 3,714,466 | 1/1973 | Spence | 307/568 |
| 4,065,678 | 12/1977 | Reese et al. | 307/264 |
| 4,345,172 | 8/1982 | Kobayashi et al. | 307/568 |
| 4,682,050 | 7/1987 | Beranger et al. | 307/270 |
| 4,874,967 | 10/1989 | Deane | 307/296.8 |
| 4,928,023 | 5/1990 | Marshall | 307/443 |

Primary Examiner—Timothy P. Callahan
Assistant Examiner—Jeffrey Zweizig
Attorney, Agent, or Firm—Raymond Kam-On Kwong; Joseph A. Sawyer, Jr.

[57] ABSTRACT

An input buffer circuit is provided that has improved speed performance. The input buffer circuit has a voltage swing of $V_{DD}-V_{th}$ to $V_{SS}$. In so doing, the speed of the input buffer signal from input to output is significantly increased. In addition, the circuit also incorporates an additional current leaker transistor that limits the output high voltage from going above $V_{DD}-V_{th}$.

15 Claims, 4 Drawing Sheets

INPUT BUFFER CIRCUIT WITH IMPROVED SPEED PERFORMANCE

FIELD OF THE INVENTION

The present invention is directed toward an input buffer circuit and more particularly to an input buffer circuit that has improved speed performance.

BACKGROUND OF THE INVENTION

An input buffer circuit is utilized within a semiconductor integrated circuit at a first stage to interface with devices outside of that integrated circuit. Typically, to allow for compatible interconnection of the integrated circuit with outside devices, the input buffer circuit has a requirement or specification that it operates at a certain input threshold voltage ($V_{TH}$). Thus, for example if the power supply voltage ($V_{DD}$) that the particular circuit is to operate is 5 volts, the $V_{TH}$ would be typically 1.5 volts. Hence, with such an input threshold voltage $V_{TH}$, for the signal to be provided at the input of the integrated circuit to be at a high value, the voltage value of the signal would be 2.0 volts or above (typically 3.0 volts). For the signal at the input of the integrated circuit to be at a low value, the voltage value of the signal would be 0.8 of a volt or below (typically 0 volts or ground).

A typical prior art input buffer circuit comprises a simple inverter. The inverter comprises a p-channel pull-up transistor coupled to an n-channel pull-down transistor. The source of the p-channel transistor is coupled to a supply voltage $V_{DD}$, while the source of the n-channel pull-down transistor is coupled to a ground voltage $V_{SS}$. It is desirable to have an inverter with high drive potential so that it can drive large capacitive load at the output. The ability of the inverter to provide a high drive potential at the output of the input buffer circuit is determined by the size of the transistors. An increase in the size of the transistors results in an increase in the drive potential.

On the other hand, static ICC, which is the current drawn by the inverter when the input at static condition (2.0 volts or above), increases as the size of the transistors increases. Static ICC must be minimized because it undesirably increases the power consumption of the circuit.

Furthermore, in order to achieve the desired input threshold voltage $V_{TH}$ of 1.5 volts, even though a typical n-channel transistor of the same size as the p-channel transistor is twice the strength of such a device by virtue of higher carrier mobility in a n-channel transistor, the n-channel device must be approximately three and one-half (3.5) times larger than the p-channel device. Hence, as the size of the p-channel transistor is increased in order to provide an increase in drive potential, there must be a corresponding increase in size of the n-channel transistor by 3.5 times in order to maintain the proper input threshold voltage $V_{TH}$. This increase in size will also cause a corresponding increase in the amount of static current ICC drawn by the input buffer circuit when the circuit is in the static high condition (typically 3.0 volts), resulting in an undesirable increase in the power consumption. Accordingly, given the inverter input threshold voltage requirement of 1.5 volts, a trade-off exists between achieving high drive potential and minimizing power consumption.

Another problem associated with this type of arrangement is that due to the sizing consideration of the n-channel and p-channel transistors as mentioned above (i.e. n-channel must be 3.5 times bigger than the p-channel), in conjunction with the fact that n-channel transistors are inherently twice as strong as p-channel transistors, the strength of a n-channel transistor to a p-channel transistor is approximately at a ratio of seven to one. Since the weak p-channel transistor is responsible for driving the inverter output when the output makes a low-to-high transition, the output is slow and the driving capability is limited during such a transition. One way to alleviate this problem is to increase the driving capability of the input buffer by coupling it in series with a second inverter. However, an additional inverter would cause additional gate delay which undesirably slows down the circuit.

An alternate prior art input buffer attempts to address these problems by using a pull-up n-channel transistor and a pull-down n-channel transistor to provide the needed output current drive capability. A weak pull-up p-channel transistor is also used to pull the output to rail (i.e. $V_{DD}$ or $V_{SS}$) and hold it there. The pull-up n-channel transistor is driven by an inverter which is driven by the input in order to obtain the correct logic for the pull-up n-channel transistor. In doing so, the output drive capability is increased because both output drivers can be comparably sized. In particular, the pull-up n-channel transistor can now be made much stronger as compared to the single inverter input buffer. Also, the input threshold voltage $V_{TH}$ of the inverter that drives the pull-up n-channel transistor is no longer limited to the ratio 3.5 to 1 that limits the single inverter input buffer. This is because the input threshold voltage $V_{TH}$ is now a function of all the elements together, not just the n-channel and p-channel transistors of the single inverter. Therefore, there is an incremental gain in speed due to the increased outpour current drive and the ability to more optimally size the inverter driving the pull-up n-channel transistor. However, this second prior art input buffer still does not provide adequate speed for some high-speed integrated circuit applications.

Hence, there is a long felt bull unsatisfied need for an input buffer circuit that has increased speed performance over prior art input buffer circuits. In addition, the input buffer circuit should be one that has a drive potential that is at least the equivalent of the prior art devices while maintaining low power consumption requirements associated therewith.

Accordingly, the present invention is directed toward an input buffer circuit which has increased speeds over prior art circuits. In addition, such a circuit will not be any more suceptable to noise problems associated with ground bounce and the like.

SUMMARY OF THE INVENTION

The present invention is directed toward an input buffer circuit that improves output current drive and provides a significant speed improvement over prior art input buffer circuits. The input buffer circuit comprises an inverter responsive to the data input signal that provides a first drive potential and a pull-up transistor coupled to the inverter for receiving the first drive potential and for providing the output signal. A pull-down transistor coupled to the pull-up transistor is responsive to the data input signal for providing the output signal. The input buffer circuit also includes a current leaker means coupled to the pull-up transistor and to the pull-down transistor for maintaining the output signal at a predetermined voltage level so as to minimize propagation delay.

Through the present invention a speed improvement is provided through the use of a small n-channel transistor to limit the voltage swing on the output of the input buffer circuit. In addition, the pull up and pull down transistors can be sufficiently large to provide adequate drive potential while allowing the input buffer circuit to draw minimal static current.

DETAILED DESCRIPTION

The present invention is directed toward an improvement in input buffer circuits. The following description is presented to enable one of ordinary skill in the art to make and use the invention as provided in the context of a particular application and its requirements. Various modifications to the preferred embodiments will be readily apparent to those skilled in the art, and the generic principles defined here; may be applied to other embodiments. Thus, the present invention is not intended to be limited to the embodiments shown, but is to be accorded the widest scope consistent with the principles and novel features disclosed herein.

Figure 1:
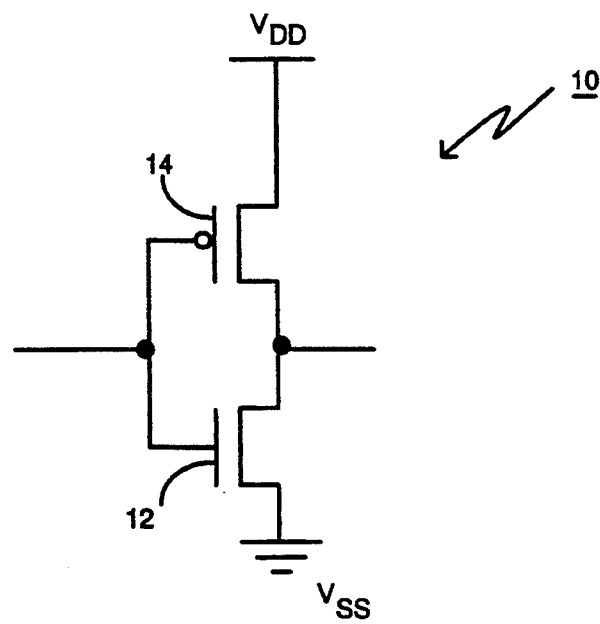
FIG. 1 is a block diagram of a first prior art input buffer circuit.

Referring now to FIG. 1, what is shown is an inverter 10 which is typically utilized as an input buffer circuit. Typically, inverter 10 comprises an n-channel transistor 12 and p-channel transistor 14. To provide threshold voltage compatible with TTL Logic (i.e. about 1.5 volts), it has been found that the n-channel transistor must be approximately three and one-half (3½) times larger than p-channel transistor to ensure that such a low threshold voltage is achieved.

Accordingly, if the size of the p-channel transistor 14 is 20, for example, the size of n-channel transistor 12 must be about 70 to ensure that the proper input threshold voltage $V_{TH}$ is obtained. Therefore, the drive potential of the inverter 10 as an input buffer circuit is limited by the size of the transistors of the inverter 10. Since the ratio between the p-and-n-channel transistors must be maintained to ensure the proper input threshold voltage $V_{TH}$ and due to practical limitations of static Icc current if the input is held at about 3 volts, the p-channel transistor 14 is very weak relative to the n-channel transistor 12.

It is known that the larger these transistors are, the more static ICC current that is drawn. Hence, the larger the inverter, the more power that will be consumed by the design. Therefore there is always a tradeoff between power consumed and size of the transistors when utilizing a simple inverter 10 as an input buffer circuit.

In addition, in this type of input buffer 10, the edge rate at the output is very slow, particularly on the low to high transition of the output. This slow edge rate is due to capacitive loading at the output of the input buffer circuit in conjunction with the relatively small size of the p-channel. Accordingly, for the above-mentioned reason the speed of operation of the inverter 10 is limited.

Figure 2:
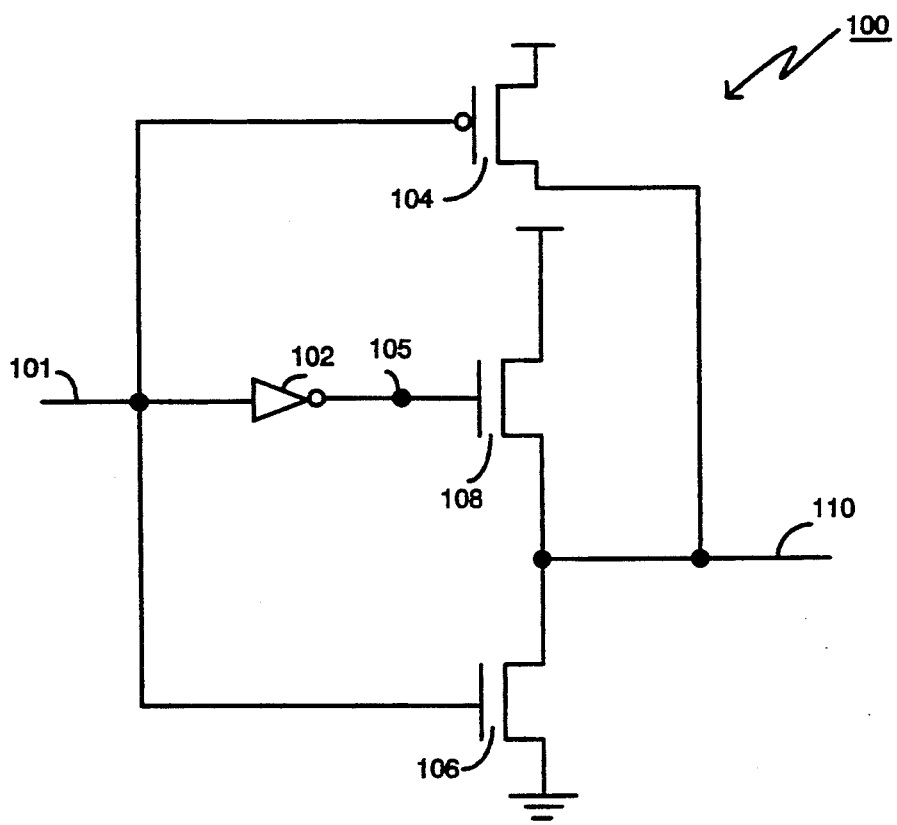
FIG. 2 is a diagram of a second prior art input buffer circuit.

There have been input buffer circuits that have been utilized to address some of the problems associated with the simple inverter 10 of FIG. 1. FIG. 2 shows a second prior art input buffer circuit 100 that has been utilized instead of the input buffer circuit of FIG. 1. The input buffer circuit 100 receives an input signal 101 which is provided to the input of an inverter 102, and also provided to the gates of transistor 104 and 106. The output of inverter 102 is coupled to the gate of transistor 108. The source of transistor 104 is coupled to $V_{DD}$ and the drain of transistor 104 is coupled to the source of transistor 108, the drain of transistor 106 and the output 110. The source of transistor 106 is coupled to ground $V_{SS}$. Transistors 106, and 108 are n-channel transistors and transistor 104 is a p-channel transistor.

This particular input buffer circuit 100 increases the drive capability of the output 110. Whereas, in the input buffer circuit 10 of FIG. 1, transistors within the inverter 10 determine the drive potential; in this embodiment, the n-channel transistors 106 and 108 determine the drive potential.

Accordingly, the inverter 102 can have approximately a n-channel transistor to p-channel transistor ratio of 2 to 1 thereby allowing the p-channel transistor to be larger while not increasing the inverter size of the n-channel transistor of the inverter. This is so because the input threshold voltage $V_{TH}$ is not just a function of inverter 102 but rather inverter 102, and transistors 106 and 108. The n-channel transistors 106 and 108 can be correspondingly larger because they draw significantly less static current under specifed input conditions. The purpose of the p-channel transistor 104 is to insure that buffer circuit will be driven from rail to rail, that is, from $V_{SS}$ to $V_{DD}$ and vice versa. Typically, transistor 104 is very weak, with a W/L on the order of a 5/1.

The input buffer circuit 100 is an improvement over that of a simple inverter 10. In the inverter 10, as has been before mentioned, the input threshold voltage $V_{TH}$ is set solely by the p- and n-channel transistors. As has also been before-mentioned, because of power requirements the size of these transistors are limited. On the other hand, the input threshold voltage $V_{TH}$ is determined on the input buffer circuit 100 by the inverter 102, as well as, the n-channel transistors 106 and 108. Accordingly the p-channel portion of the inverter 102 can be larger, as well as having larger n-channel transistors 106 and 108. In this configuration, transistors 106 and 108 do not draw any significant static ICC. When the input is 0.8 volts or lower (as specified), transistor 106 is practically off. The output of inverter 102 is high (node 105) thus turning on transistor 108 and transistor 104 is also on and thus the output goes to $V_{DD}$. When the input is 2 volts or higher (typically 3.0 volts), transistor 106 is on. The output of inverter 102 is low (node 105) thus turning off transistor 108 and the output goes to VSS. In this case, there is some leakeage through transistor 104 but is not significant. Clearly then, only inverter 102 draws static ICC under the specified input conditions. Inverter 102 can be made to draw less static ICC than input buffer 10 depending on design requirements.

Although this design addresses the drive potential problem and also provides an incremental increase in speed because the n-channel transistors 106 and 108 can be larger, for some applications the speed improvement is not adequate. As integrated circuit frequencies become faster and faster and input to output delays become shorter, it becomes important to develop improved input buffer circuits to enhance the speed performance of the integrated circuit.

Figure 3:
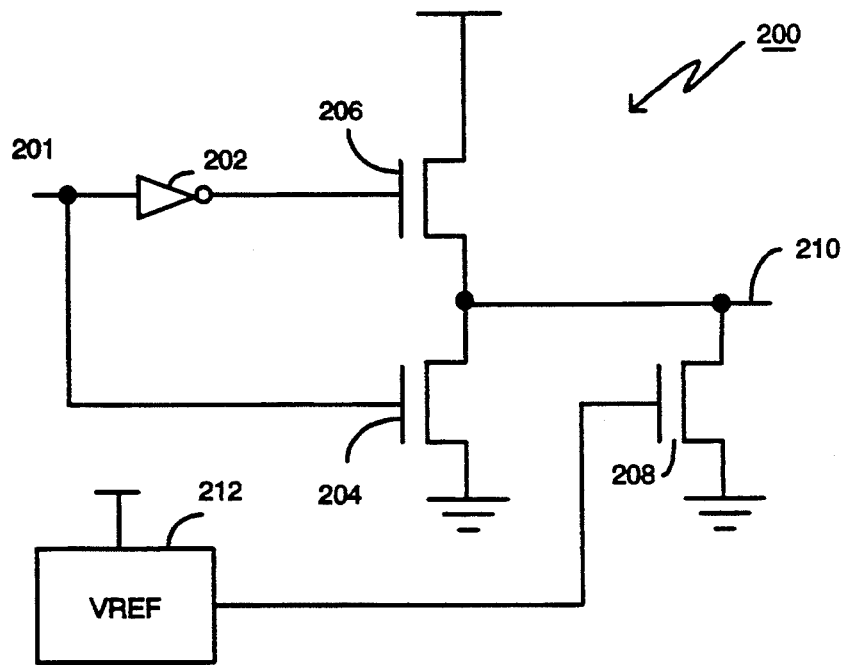
FIG. 3 is a diagram of an input buffer circuit in accordance with the present invention.

Referring now to FIG. 3, what is shown is a schematic diagram of an input buffer circuit 200 in accordance with the present invention. The input buffer circuit 200 has improved speed performance over the prior art input buffer circuits 10 and 100 of FIGS. 1 and 2.

The input buffer circuit 200 receives an input signal 201 which is provided to the input of inverter 202 and a gate of n-channel transistor 204. The output of inverter 202 is coupled to the gate of n-channel transistor 206. The drain of transistor 206 is coupled to $V_{DD}$. The source of transistor 206 is coupled to the output 210, the drain of transistor 204 and the drain of an n-channel transistor 208. The sources of transistors 204 and 208 are coupled to ground. The gate of transistor 208 is coupled to a reference voltage source 212. The reference voltage (VREF) 212 could be provided by a variety of sources one of which will be described in detail later in the specification.

This type of input buffer circuit has significantly increased speed of operation. This input buffer circuit 200 has the drive potential advantage above-described in the prior art input buffer circuit 100 of FIG. 2 through the cooperation of large n-channel transistors 204 and 206 with the inverter 202. Hence, similar to the input buffer circuit 100, the transistors 204 and 206 can be very large as described in the prior art.

In addition, the p-channel pull-up transistor 104 of FIG. 2 has been eliminated to prevent the output 210 from swinging from rail to rail ($V_{SS}$ to $V_{DD}$ and vice versa). The output now swings from $V_{SS}$ to $V_{DD}$-$V_{th}$ and vice versa, where $V_{th}$ is the threshold voltage of a n-channel MOS transistor. This significantly increases the speed during high to low transitions of the output signal of the input buffer circuit 200 because of the reduced voltage swing. For a given output edge rate the output of the circuit 200 will reach a given voltage faster than circuit 100 due to the fact that it starts from a lower "high" voltage of $V_{DD}$-$V_{th}$, instead of VDD as in the case of circuit 100.

The function of n-channel transistor 208 is to prevent voltage overshoot when the output voltage exceeds $V_{DD}$-$V_{th}$ by providing a small leakage current to counteract the overshoot. The transistor 208 is a leakage device which is sized such that it will provide a very small leakage current. In this embodiment the leakage current would be in the range of 10–15 microamps and the transistor would have a W/L ratio of approximately 4/1. It should also be noted that transistor 208 is smaller than transistors 204 and 206. In this embodiment, transistor 208 is off when the output is at a low voltage. On the other hand, the reference voltage source 212 is set such that approximately a $2V_{th}$ potential is applied to the gate.

Figure 4:
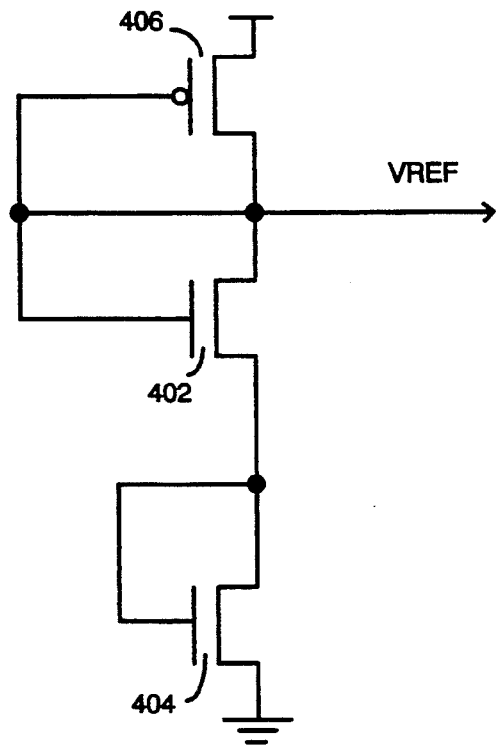
FIG. 4 is a diagram of the reference current generator for use with the input buffer circuit of FIG. 3.

One embodiment of a reference current source is shown in FIG. 4 as reference current source circuit 212. The reference current circuit 212 comprises two series connected n-channel transistors 402 and 404 coupled to a weaker p-channel transistors 406. The strong n-channel transistor 402 and 404 are pulled up by the weak p-channel transistor, thereby insuring 2 $V_{TH}$ is always provided to the gate of the weaker transistor 208 (FIG. 3). Accordingly when transistor 204 turns off due to an overshoot condition occurring on the output signal 210, the transistor 208 will sink a minimal amount of current to pull the output signal back down to $V_{DD}$-$V_{th}$ in preparation for the next high to low transition.

Through the present invention, the speed of the input buffer circuit has been significantly increased due to limiting the voltage swing to $V_{DD}$-$V_{TH}$ to $V_{SS}$ rather than from $V_{DD}$ to $V_{SS}$ as shown in the prior art. In addition, through the use of the leakage transistor 208, the overshoot problem on output 210 associated with n-channel transistor 206 turning off is minimized.

Figure 5:
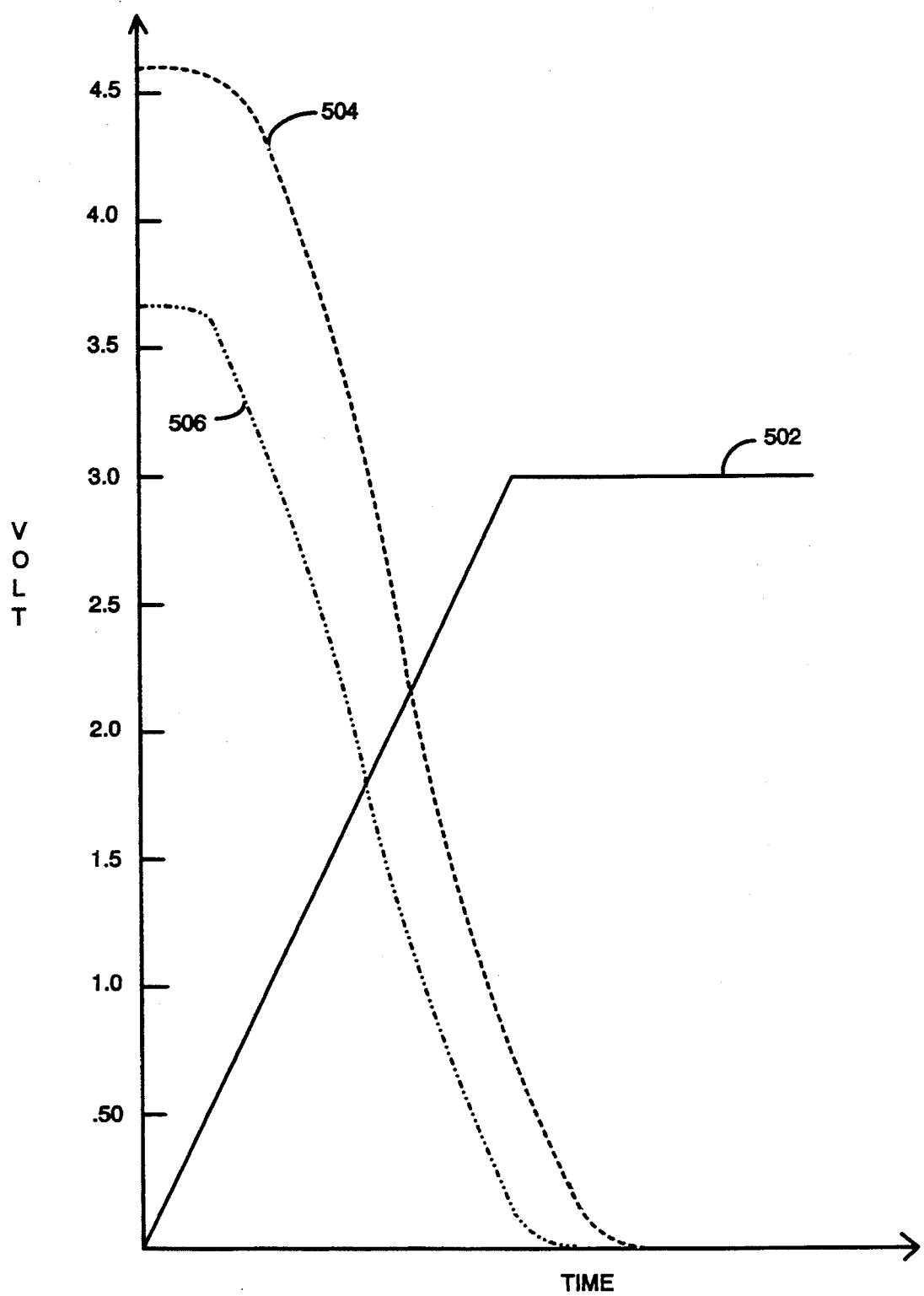
FIGS. 5 and 6 show the low and high transitions and the high and low transitions for the circuits of FIG. 2 and FIG. 3 respectively.
Figure 6:
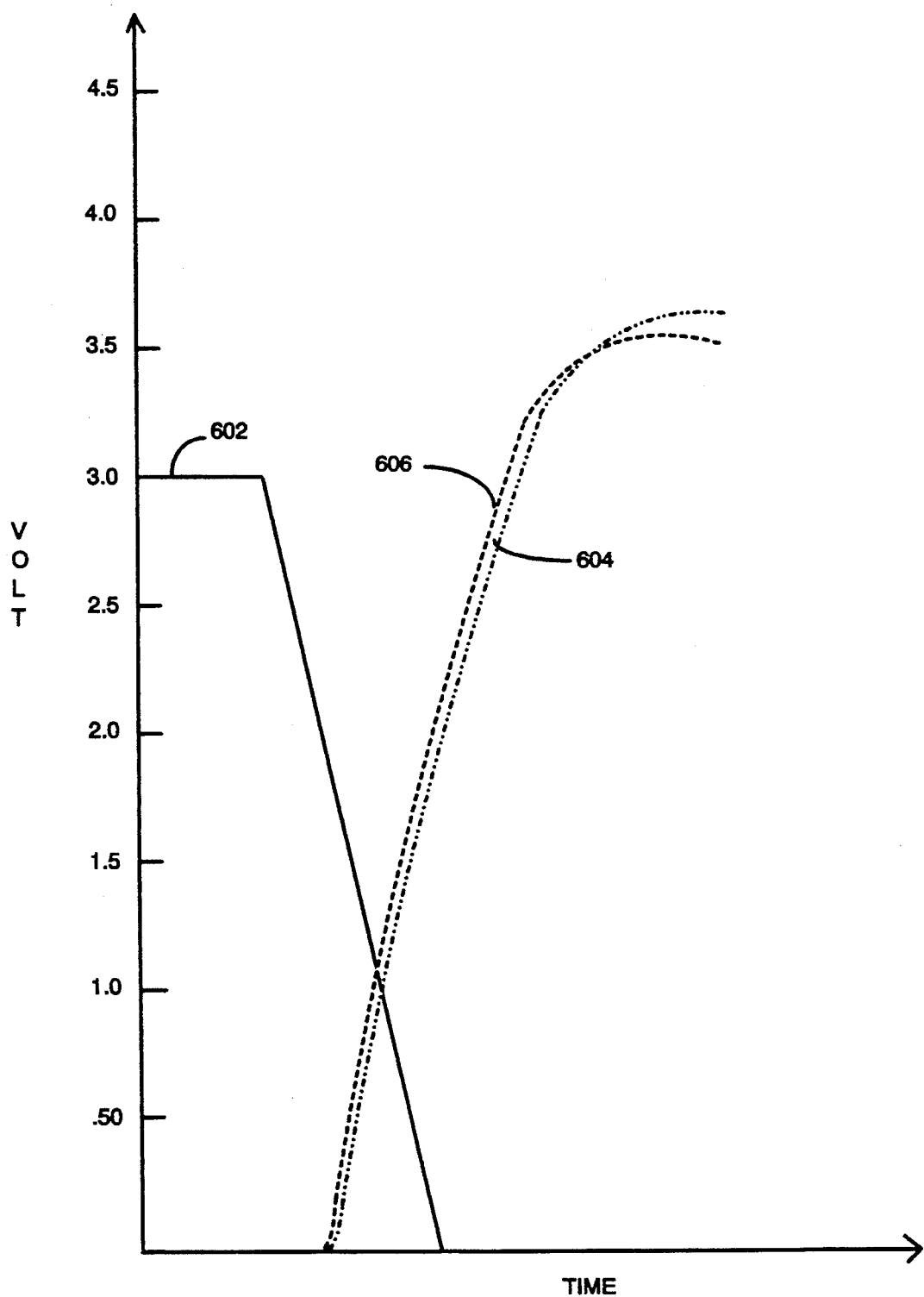

To more particularly show the advantages of the present invention refer now to FIGS. 5 and 6. What is shown in the Figures are waveforms representing an input signal 502 that is provided to the input buffer circuit, the output signal 504 from the prior art input buffer circuit 100 and the output signal 506 from the input buffer circuit 200 of the present invention.

FIG. 5 shows the output signals 504 and 506 going from a high to low transition when the input signal goes from low to high. FIG. 6 shows the output signals 604 and 606 going from a low to high transition when the input signal goes from high to low.

Referring now to FIG. 5, the output signal 504 is at $V_{DD}$ or approximately 4.65 volts at the high value, while in contrast the output signal 506 is at $V_{DD}$-$V_{th}$ or approximately 3.72 volts. As is seen, the difference in high voltage level when the high to low transition occurs translates into a significant increase in speed. It has been found that the input buffer circuit 200 has approximately a 500 picosecond speed increase over input buffer circuit 100 due to the $V_{th}$ drop on the output from the power supply voltage $V_{DD}$.

Referring now to FIG. 6. What is shown in the figures are waveforms representing an input signal 602 that is provided to the input buffer circuit, the output signal 604 from the prior art in, put buffer circuit 100 and the output signal 606 from the input buffer circuit 200 of the present invention. It is seen that there is also a slight speed improvement from a low to high transition for the input buffer circuit 200. This improvement is due mainly to the larger n-channel transistors used in the present invention.

Accordingly, it has been shown that in the output transition from high to low there is a significant improvement in the speed of the input buffer circuit. In addition, by including a leakage transistor, noise problems associated with overshot at the output are compensated for.

It is understood that the above-described embodiment is merely illustrative of the possible specific embodiments which can represent applications of the principles of the present invention. One of ordinary skill in the art will see that numerous and various other arrangements can be readily devised in accordance with these principles without departing from the spirit and scope of the present invention. Accordingly, many modifications may be made by one of ordinary skill in the art without departing from the spirit and scope of the appended claims.

What is claimed is:

1. An input buffer circuit for receiving a data input signal and for providing an output signal comprising:
   an inverter responsive to the data input signal for providing a first drive potential;
   a pull-up transistor coupled to the inverter for receiving the first drive potential and for providing the output signal, said output signal being maintained at a predetermined voltage level so as to minimize propagation delay;

a pull-down transistor coupled to the pull-up transistor, the pull-down transistor being responsive to the data input signal for providing the output signal;

a current reference circuit for generating a current reference signal; and a current leaker means coupled to the pull-up transistor and to the pull-down transistor for providing noise protection to the output signal, the current leaker means being responsive to and kept in an active state by the current reference signal of the current reference circuit.

2. The input buffer as recited in claim 1, wherein the pull-up transistor is a N-channel MOS device, the pull-up transistor being coupled to an upper supply voltage.

3. The input buffer as recited in claim 2, wherein the pull-down transistor is a N-channel MOS device, the pull-down transistor being coupled to a lower supply voltage.

4. The input buffer as recited in claim 3, wherein the current leaker means comprises a MOS transistor.

5. The input buffer as recited in claim 4, wherein the MOS transistor is an N-channel MOS device, the MOS transistor being coupled to the lower supply voltage.

6. The input buffer as recited in claim 5, wherein the MOS transistor is smaller than the pull-up transistor and the pull-down transistor.

7. The input buffer as recited in claim 4, wherein the predetermined voltage level equals to the upper supply voltage minus one threshold voltage of a N-channel MOS device.

8. The input buffer as recited in claim 7, wherein the output signal varies from a first voltage level which is equal to the lower supply voltage to a second voltage level which is equal to the upper supply voltage minus one threshold voltage of a N-channel MOS device.

9. An input buffer circuit for receiving an upper supply voltage, a lower supply voltage and a data input signal and for providing an output signal comprising:

an inverter responsive to the data input signal for providing a first drive potential;

a pull-up transistor coupled to the inverter for receiving the first drive potential and to the upper supply voltage for providing the output signal, the output signal being maintained at a predetermined voltage level so as to minimize propagation delay, the pull-up transistor being a N-channel MOS device;

a pull-down transistor coupled to the pull-up transistor and to the lower supply voltage, the pull-down transistor being responsive to the data input signal for providing the output signal, the pull-down transistor being a N-channel MOS device;

a current reference circuit for generating a current reference signal; and a current leaker circuit comprises a MOS transistor, the MOS transistor being coupled to the lower supply voltage, the pull-up transistor and the pull-down transistor, the MOS transistor being responsive to and kept in an active State by the current reference signal of the current reference circuit for providing noise protection to the output signal.

10. The input buffer as recited in claim 9, wherein the MOS transistor is smaller than the pull-up transistor and the pull-down transistor.

11. The input buffer as recited in claim 10, wherein the predetermined voltage level equals to the upper supply voltage minus one threshold voltage of a N-channel MOS device.

12. The input buffer as recited in claim 11, wherein the output signal varies from a first voltage level which is equal to the lower supply voltage to a second voltage level which is equal to the upper supply voltage minus one threshold voltage of a N-channel MOS device.

13. An input buffer circuit for receiving an upper supply voltage, a lower supply voltage and a data input signal and for providing an output signal comprising:

an inverter coupled to the upper supply voltage and the lower supply voltage, the inverter being responsive to the data input signal for providing a first drive potential;

a pull-up transistor coupled to the inverter for receiving the first drive potential and to the upper supply voltage for providing the output signal, the output signal being maintained at a predetermined voltage level so as to minimize propagation delay, the pull-up transistor being a N-channel MOS device;

a pull-down transistor coupled to the pull-up transistor and to the lower supply voltage, the pull-down transistor being responsive to the data input signal for providing the output signal, the pull-down transistor being a N-channel MOS device; and a current leaker circuit coupled to the pull-up transistor and to the pull-down transistor, the current leaker circuit comprising:

a reference current signal circuit coupled to the upper supply voltage and the lower supply voltage for providing a reference current signal, the reference current signal circuit comprising:

a first reference transistor having a sourced a drain and a gate, the gate of the first reference transistor being coupled to its drain and the output of the reference current signal circuit, its source being coupled to the upper supply voltage, the first reference transistor being a p-channel MOS device;

a second reference transistor having a source, a drain and a gate, the drain of the second reference transistor being coupled to its gate and the gate of the first reference transistor, the second reference transistor being a N-channel MOS device; and a third reference transistor having a source, a drain and a gate, the drain of the third reference transistor being coupled to its gate and the source of the second reference transistor, its source being coupled to the lower supply voltage, the third reference transistor being a N-channel MOS device; and a MOS transistor, the MOS transistor being coupled to the lower supply voltage, the pull-up transistor and the pull-down transistor, the MOS transistor being a N-channel MOS device, the MOS transistor being responsive to and kept in an active state by the reference current signal for providing noise protection to the output signal.

14. The input buffer as recited in claim 13, wherein the MOS transistor is smaller than the pull-up transistor and the pull-down transistor.

15. The input buffer as recited in claim 14, wherein the output signal varies from a first voltage level which is equal to the lower supply voltage to a second voltage level which is equal to the upper supply voltage minus one threshold voltage of an N-channel MOS device.

* * * * *